(12) United States Patent
Diana et al.

(10) Patent No.: US 8,821,821 B2
(45) Date of Patent: Sep. 2, 2014

(54) METHOD FOR THE PURIFICATION OF FLUORINE

(75) Inventors: Oliviero Diana, Vilvoorde (BE); Peter M. Predikant, Hannover (DE); Philippe Morelle, Alsemberg (BE); Maurizio Paganin, Brussels (BE); Christoph Sommer, Neckarsulm (DE)

(73) Assignee: Solvay SA, Brussels (BE)

( * ) Notice: Subject to any disclaimer, the term of this patent is extended or adjusted under 35 U.S.C. 154(b) by 0 days.

(21) Appl. No.: 13/814,033

(22) PCT Filed: Aug. 3, 2011

(86) PCT No.: PCT/EP2011/063350
§ 371 (c)(1),
(2), (4) Date: Feb. 4, 2013

(87) PCT Pub. No.: WO2012/016997
PCT Pub. Date: Feb. 9, 2012

(65) Prior Publication Data
US 2013/0130505 A1      May 23, 2013

(30) Foreign Application Priority Data

Aug. 5, 2010  (EP) .................................... 10172034

(51) Int. Cl.
B01D 53/56    (2006.01)
C01B 7/00     (2006.01)
C01B 7/19     (2006.01)
H01L 21/306   (2006.01)
C01B 7/20     (2006.01)
H01L 21/02    (2006.01)

(52) U.S. Cl.
CPC . *C01B 7/20* (2013.01); *C01B 7/197* (2013.01); *H01L 21/30604* (2013.01); *H01L 21/02057* (2013.01)
USPC ........... 423/235; 423/288; 423/500; 423/501; 423/502; 423/503; 423/504

(58) Field of Classification Search
None
See application file for complete search history.

(56) References Cited

U.S. PATENT DOCUMENTS

| 3,989,808 | A |   | 11/1976 | Asprey |
| 5,284,605 | A | * | 2/1994 | Nicolas ............................ 588/1 |
| 5,362,469 | A |   | 11/1994 | Seseke-Koyro et al. |
| 5,431,778 | A |   | 7/1995 | Dahm et al. |
| 5,585,085 | A |   | 12/1996 | Seseke-Koyro et al. |
| 6,620,394 | B2 |  | 9/2003 | Uhm et al. |
| 2004/0038803 | A1 | * | 2/2004 | Zhou et al. ...................... 502/35 |
| 2009/0026410 | A1 |   | 1/2009 | Stoner |
| 2010/0099931 | A1 | * | 4/2010 | Waki et al. ..................... 570/134 |
| 2011/0097253 | A1 | * | 4/2011 | Iikubo et al. .................. 423/235 |

FOREIGN PATENT DOCUMENTS

| FR |   | 2611195 | A1 | 8/1998 |
| WO | WO | 9827006 | A1 | 6/1998 |
| WO | WO | 03046244 | A2 | 6/2003 |
| WO | WO | 2006043125 | A1 | 4/2006 |
| WO | WO | 2007116033 | A1 | 10/2007 |
| WO | WO | 2009080615 | A2 | 7/2009 |

OTHER PUBLICATIONS

Jacob, Eberhard, et al —"A Simple Method for the Purification of Fluorine", 1977, Journal of Fluorine Chemistry, vol. 10, Issue No. 2, pp. 169-172; 4 pgs.
Rondeau, R.E., "Slush Baths", 1966, Journal of Chemical and Engineering Data, vol. 11, Issue No. 1, pp. 124; 1 pg.

* cited by examiner

*Primary Examiner* — Duy Deo

(57) ABSTRACT

Elemental fluorine is often manufactured electrochemically from a solution of KF in hydrogen fluoride and contains varying amounts of entrained electrolyte salt in solid form as impurity. The invention concerns a process for the purification of such impure elemental fluorine by contact with liquid hydrogen fluoride, e.g., in a jet gas scrubber or by bubbling the raw fluorine through liquid hydrogen fluoride. After this purification step, any entrained hydrogen fluoride is removed by adsorption, condensing it out or both. After passing through a filter with very small pores, the purified fluorine is especially suited for the semiconductor industry as etching gas or as chamber cleaning gas in the manufacture of semiconductors, TFTs and solar cells, or for the manufacture of micro-electromechanical systems ("MEMS").

17 Claims, No Drawings

METHOD FOR THE PURIFICATION OF FLUORINE

The present application is a U.S. national stage entry under 35 U.S.C. §371 of International Application No. PCT/EP2011/063350 filed Aug. 3, 2011, which claims priority benefit of European patent application number 10172034.0 filed on Aug. 5, 2010, the entire content of this application being incorporated herein by reference for all purposes.

The present invention concerns a process for the manufacture of purified elemental fluorine.

Elemental fluorine ($F_2$) is used, i.a., as etching agent or doping agent in the manufacture of semiconductors, microelectromechanical devices, solar cells, TFTs (thin film transistors), as agent for cleaning the chambers used therein, for the manufacture of fluorinated organic compounds, e.g. for the manufacture of fluorinated ethylene carbonates and fluorinated propylene carbonates which are solvents for Li ion batteries, and for the manufacture of $IF_5$ and $SF_6$. It is also used to treat the surface of plastic materials, e.g. for fluorination of the inner surface, the outer surface or both of fuel tanks. Another field of application of fluorine is the surface fluorination of parts made from polymers to provide a finished surface.

U.S. Pat. No. 3,989,808 discloses the purification of raw fluorine using potassium fluoronickelate complexes. E. Jacob and K. O. Christe in J. Fluorine Chem. 10 (1977), pages 169 to 172 disclose a 70 to 63 K trap-to-trap distillation, combined with a treatment by adding $SbF_5$ to remove oxygen.

Fluorine is often manufactured by the electrolysis of hydrogen fluoride (HF) in the presence of molten/dissolved fluoride salts; especially adducts of HF and KF having a formula of about KF·(1.8-2.3) HF are applied as electrolyte salts.

It was observed that the $F_2$ produced electrolytically from such molten/dissolved electrolyte salts contains particles of the electrolyte salt which are entrained in crystalline or paste-like form in the flow of $F_2$ leaving the cell wherein electrolysis is performed. It is generally undesired to apply fluorine containing such particles, e.g. in the fields of technique mentioned above. Especially for the application in the semiconductor industry, the used agents must be of high purity. Such particles are also generally undesired in view of potential damaging of the compressors used to pressurize the produced fluorine and of corrosion problems in lines, tanks and apparatuses used in the manufacture, storage and delivery of $F_2$.

Object of the present invention is to provide a process for the manufacture of purified fluorine. Another object of the present invention is to provide a process for the manufacture of purified fluorine which is especially suitable for the application in the semiconductor industry.

These objects and other objects as apparent from the description and the claims are achieved by the invention.

Consequently, the process of the present invention concerns a process for the manufacture of purified fluorine comprising a purification treatment wherein fluorine which contains solid impurities is subjected to a solid-removing treatment wherein the solid-removing treatment comprises at least one step of contacting the fluorine with liquid hydrogen fluoride, and a subsequent purification treatment comprising at least one step of removing hydrogen fluoride from the fluorine after contact with liquid hydrogen fluoride. Additionally, the fluorine may be subjected to at least one step of contacting it with a solid sorbent for HF, and it may additionally subjected to at least one step of passing it through a particle filter. The fluorine may be passed through a particle filter before and/or after the solid removing treatment and the purification treatment mentioned above. In the frame of the present invention, the term "solids" and particles" are interchangeable.

The $F_2$ can be contacted with technical grade HF. If desired, purified HF can be applied.

Methods to purify hydrogen fluoride from phosphorous compounds, sulfur compounds, arsenic compounds, metals, hydrocarbons and water are well known. See for example U.S. Pat. No. 5,362,469 and U.S. Pat. No. 5,585,085. According to U.S. Pat. No. 5,362,469, water, arsenic compounds, boron compounds, phosphorous compounds and sulfur compounds as well as carbon compounds and metal compounds are removed from HF by contacting liquefied hydrogen fluoride with lithium fluoride and elemental fluorine. The hydrogen fluoride is then distilled to provide pure hydrogen fluoride. According to U.S. Pat. No. 5,585,085, water and hydrocarbons are removed from hydrogen fluoride by contacting it with elemental fluorine and subsequent distillation.

The fluorine may preferably be contacted with a purified hydrogen fluoride which is essentially free of at least phosphorous compounds, sulfur compounds and arsenic compounds. Hydrogen fluoride can be purified according to the process of U.S. Pat. No. 5,362,469 and then has a content of water of less than 1 ppm.

The process of the present invention is preferably applied to fluorine which was produced by the electrolysis of KF dissolved in hydrogen fluoride, for example, of adducts having the formula KF·(1.8-2.3)HF, especially of a melt of KF·2HF (or its solution in HF). The term "solid impurities" denotes preferably those impurities which are present in fluorine manufactured by electrolytic processes; preferably, the solid impurities essentially consist of particles which are addition products of KF and HF, mainly having the formula KF·(1.8-2.3)HF.

Thus, in one step, the raw fluorine is contacted in gaseous form with liquid HF. The fluorine may be contacted with the liquid hydrogen fluoride in any convenient way. The term "raw fluorine" denotes fluorine before it enters the step of treatment with liquid HF. Often, it is sufficient to perform one such step. But if desired, the contact between fluorine and liquid HF can be performed 2 times or even more often.

To contact the raw fluorine which contains particles with liquid HF, the raw fluorine for example may be introduced in small bubbles into the liquid hydrogen fluoride, for example, by passing it through a line or tube which is submerged in the liquid HF which is contained in a vessel. A good dispersion of fluorine in HF can be provided by passing the fluorine through a frit made of Monel metal or nickel into the liquid HF. The contact between fluorine and the HF is improved by stirring the reactants and/or otherwise providing improved contact between fluorine and HF, for example, by packings like Raschig rings.

During contact of the raw fluorine with the liquid HF, particles and even some HF entrained in the raw fluorine are retained by the liquid HF. The treated $F_2$ leaves the vessel and is subjected to a further purification.

The liquid HF with which the raw fluorine is contacted as described above has a low temperature and consequently a low vapor pressure. The temperature of the liquid HF during its purifying contact with the fluorine is equal to or higher than the melting point of the HF at the respective pressure in the vessel or the scrubber. Preferably, it is equal to or higher than −83° C., more preferably, it is equal to or higher than −82° C. It is preferably equal to or lower than −40° C. The temperature of the liquid HF is preferably in the range between −60° C. and −82° C. The HF can be cooled by cooling machines which provide a suitably cooled liquid to heat exchangers to keep the HF at the desired low temperature. In a preferred embodiment, the liquid HF in the vessel is indirectly cooled by means of liquid $N_2$ which, when passing from the liquid to the gaseous state, provides the desired cooling effect.

Contacting of $F_2$ in the form of bubbles with liquid HF in a vessel has the advantage that no HF must be pumped continuously. The level of liquid HF in the vessel tends to increase because entrained HF and solids are absorbed from the raw fluorine. Consequently, from time to time or continuously, a certain amount of the HF containing dissolved electrolyte salt is withdrawn from the vessel. The withdrawn liquid is preferably regenerated by distillation to obtain HF free of dissolved electrolyte salt; alternatively, withdrawn liquid may be fed into the electrolytic cells. This alternative is very suitable for fluorine producing plants with small and medium production capacities, for example, 100 kg of $F_2$ per year up to several 100 tons $F_2$ per year, of fluorine, e.g. plants for the on site production of fluorine for the use in semiconductor applications, for the manufacture of MEMS, photovoltaic cells and for chamber cleaning in connection with these applications.

The raw fluorine may also be contacted, in an alternative embodiment, with a flow of liquid hydrogen fluoride. If desired, the gaseous fluorine can be contacted with the HF in a countercurrent mode.

In a preferred mode of this embodiment, the liquid HF and the fluorine are contacted in a jet gas scrubber. In the jet gas scrubber, liquid HF is preferably introduced in liquid form in the upper part of the scrubber; it is sprayed in the form of small liquid particles into a gas stream of $F_2$ which is to be purified. The liquid HF is collected in the bottom of the scrubber and preferably circulated via a cooler.

The liquid HF with which the raw fluorine is contacted as described above has a low temperature and consequently a low vapor pressure. Also in this embodiment, the temperature of the liquid HF during its purifying contact with the fluorine is equal to or higher than the melting point of the HF at the respective pressure in the vessel or the scrubber. Preferably, it is equal to or higher than $-83°$ C., more preferably, it is equal to or higher than $-82°$ C. It is preferably equal to or lower than $-40°$ C. The temperature of the liquid HF is preferably in the range between $-60°$ C. and $-82°$ C. The HF can be cooled by cooling machines which provide a suitably cooled liquid to heat exchangers to keep the HF at the desired low temperature. In a preferred embodiment, the HF is indirectly cooled by means of liquid $N_2$ which, when passing from the liquid to the gaseous state, provides the desired cooling effect.

The pressure during contact of fluorine and liquid hydrogen fluoride is selected such that the hydrogen fluoride remains in the liquid state. Preferably, the pressure is equal to higher than 0.5 bar (abs.). More preferably, it is equal to or higher than 1 bar (abs). Preferably, it is equal to or lower than 20 bar (abs), and more preferably, equal to or lower than 12 bar (abs). If $F_2$ is passed in the form of bubbles through liquid hydrogen fluoride in a vessel as described above, this is preferably performed at a pressure which corresponds to the ambient pressure plus the delivery pressure needed to press the raw fluorine into the liquid hydrogen fluoride. This delivery pressure is in the range of some hundred millibar depending on the height of the liquid hydrogen fluoride. Often, the contact of raw fluorine with the liquid hydrogen fluoride is performed at a pressure equal to or higher than ambient pressure to a pressure equal to or lower than 2 bar (abs).

For technical reasons, the contact between $F_2$ and HF is preferably performed at ambient pressure or slightly above ambient pressure, for example, at ambient pressure (about 1 bar abs) up to about 1.5 bar (abs). Good results are achieved in a technically very feasible manner at ambient pressure (about 1 bar abs), optionally at ambient pressure plus the delivery pressure of the fluorine gas.

Due to the low temperature of the liquid HF during its contact with fluorine, the vapor pressure of HF is very low. The $F_2$ having been treated with liquid HF may contain, for example, up to 2% by weight, and often less than that, e.g. up to 1000 ppm of HF.

The liquid HF which is used in the purification step is preferably circulated or reused, optionally after regeneration, e.g. by a step of distillation to remove any solids washed out from the raw fluorine as described above. The advantage is that any water initially present in the HF reacts with $F_2$ to form HF and $OF_2$; after some time, the water is consumed, and the fluorine to be purified will not be consumed by water in a side reaction, and the fluorine will not take up any $OF_2$ anymore because it is no longer formed.

The step of treating raw fluorine with liquid HF, as outlined above, may be the first of any treatment steps performed to obtain purified fluorine according to the process of the present invention. Often, a pretreatment step can be foreseen to treat the fluorine leaving the fluorine generator before the treatment with liquid HF is performed. For example, the fluorine can be passed through a particle filter before contacting it with liquid HF and subjecting it to a low temperature treatment and/or a treatment with an adsorbent.

The liquid hydrogen fluoride used for the removal of impurities from the fluorine will, after some time, contain an undesired level of impurities. Notably electrolyte salt (adducts from HF and KF), will be present in the HF in dissolved form. Accordingly, the volume of the HF increases. The hydrogen fluoride containing dissolved electrolyte must not be dumped. It is preferred to withdraw a part of the HF from the circulation or from the reactor in which the contact with $F_2$ is performed. The process of withdrawal of HF from the reactor or the circulated HF can be performed continuously or intermittent.

According to a preferred embodiment of the present invention, the withdrawn HF is introduced into the electrolytic cell or cells wherein $F_2$ is produced. In these cells, HF is electrolyzed to form $H_2$ and $F_2$, and thus, the HF content must be replenished anyway. Alternatively, the HF withdrawn from the purification step can be applied as reagent in processes for which the presence of the impurities is acceptable. For example, the HF can be used as fluorinating agent in catalytic or non-catalytic chlorine-fluorine exchange reactions or HF addition reactions of unsaturated compounds, or it can be used for the manufacture of potassium fluoroaluminate-based fluxes for aluminium brazing: for the manufacture of these fluxes, potassium fluoride and HF (the main constituents of spent HF) are needed anyway.

According to still another alternative, the withdrawn hydrogen fluoride may be purified, for example, by distillation.

It is preferred, as said above, to withdraw a part of the HF continuously or intermittent from the circulation line or the reactor or vessel in which HF and $F_2$ are contacted. Thus, a preferred process of the present invention concerns an integrated process wherein fluorine is electrolytically produced in one or more electrolytic cells from an electrolyte containing molten adducts of KF and HF or, respectively, KF dissolved in HF, to produce fluorine containing solids, especially entrained electrolyte salt, especially in the form of $KF·(1.8-2.3)HF$, and wherein the produced fluorine containing solids is subjected to a first purification treatment wherein the electrolytically produced fluorine is contacted with liquid hydrofluoric acid to reduce the content of solids, and wherein a part of the liquid HF is continuously or intermittently withdrawn from the first purification treatment and introduced into the electrolytic cell or cells producing fluorine. Often, the electrolytic solution in the cell or cells corresponds to compounds of the formula KF·(1.8-2.3) HF. The fluorine leaving the electrolytic cells may often also contain entrained hydrogen fluoride.

The advantage of this embodiment of the invention is that water-free HF is withdrawn from the purifying step and introduced into the electrolytic cell or cells (because fluorine reacts with water). The withdrawn HF contains entrained adducts of KF and HF but this is of no disadvantage because adducts of KF and HF are used for electrolysis.

After the purification treatment by contacting the fluorine with liquid HF, at least one step of removing hydrogen fluoride from the fluorine is performed. Preferably, the fluorine withdrawn from the contact with liquid HF is subjected to a low temperature treatment to condense HF, to a treatment with an adsorbent for HF, or, most preferably, to a treatment combining both kinds of purification.

The term "low temperature treatment" denotes a contact of the fluorine to be purified with cooled surfaces of a cooling apparatus, e.g. a cooled trap or a cooled heat exchanger wherein the cooled surfaces are cooled to a temperature of equal to or lower than −50° C. Preferably, they are cooled to a temperature of equal to or lower than −60° C. The temperature is preferably equal to or greater than −185° C. because, at ambient pressure, the boiling point of fluorine is about −188° C. Cooling liquids for this temperature range are generally known, e.g. from R. E. Rondeau, J. Chem. Eng. Data, II, 124 (1966). US patent application publication 2009-0026410 provides heat transfer fluids comprising an ether and an alkylbenzene which are suitable in heat exchangers operating at temperatures as low as −115° C. Liquid nitrogen cools also be used as indirect cooling agent because upon evaporation, liquid $N_2$ provides latent heat of evaporation exerting a cooling effect. The melting point of HF under standard pressure (100 kPa) is −83.6° C. Thus, under the conditions of the process of the invention, and depending from the pressure, the HF in the trap will solidify if the temperature is respectively low; the higher the pressure, the lower the temperature at which the HF solidifies. While performing the process at a temperature as low as possible improves the separation factor (because the partial pressure of HF is lower), it is preferred to select pressure and temperature such that the separated HF does not solidify because the separated HF can be removed from the trap more easily in liquid state than HF being in a solid state. The removal of HF at conditions at which the condensed HF is liquid is preferred. As mentioned above, at ambient pressure, HF solidifies at about −83.6° C. Under the elevated pressure of the process of the invention, the solidification temperature is lower, thus, the process can be performed at temperatures even lower than −83.6° C. A preferred range for the treatment at low temperature is from equal to or greater than −70° C. to equal or higher than −82° C.

Any HF recovered in the low temperature treatment may be recycled to the electrolytic cells, to the circulating liquid HF, or it can be used for any other purpose or even be dumped.

During the low temperature treatment, it is preferred to select the temperature and the pressure such that the condensed HF remains liquid. That provides for the easy removal of separated HF from the cooling apparatus.

The pressure of the fluorine during the low temperature treatment is preferably equal to or greater than 1.5 Bar absolute (150 kPa abs.); the term "Bar abs." is equivalent to "Bara". More preferably, the pressure is equal to or greater than 2 bar (abs). The pressure is preferably equal to or lower than 20 Bara (2.000 kPa abs.), and more preferably, it is equal to or lower than 15 Bara (1.500 kPa abs). A preferred range is the pressure is from equal to or greater than 1 bar (abs) and equal to or lower than 20 bar (abs), preferably to equal to or lower than 12 bar (abs).

Performing the process at a pressure in the upper region, e.g. between 6 and 20 bar (abs.) or between 6 and 12 bar (abs), at a given temperature improves the separation of the entrained HF because the partial pressure of HF is lower at a higher pressure, and thus the residual content of HF in the treated fluorine is lower. On the other hand, for practical reasons it may be preferred to perform the process at a lower pressure, e.g. in the range from 2 to 4 bar (abs.) because $F_2$ is a very aggressive compound.

According to another embodiment, the fluorine, after the treatment with liquid HF, is subjected to a treatment with an adsorbent. Any adsorbents, preferably solid adsorbents, can be applied which are inert towards fluorine and HF. The preferred adsorbents are KF and NaF, and NaF is especially preferred.

Often, the fluorine is passed through one or more towers containing a filling of NaF. If desired, redundant towers may be applied, such that one tower is regenerated and the other is in operation for HF removal.

In a preferred embodiment, the fluorine is first treated with liquid HF at a low temperature to remove entrained solids (and even some entrained HF, due to the low temperature of the liquid HF), then it is subjected to a low temperature treatment to remove entrained HF, and then it is subjected to a treatment with NaF to remove residual entrained HF.

According to one preferred alternative of this preferred embodiment, the fluorine is first treated with liquid HF in a jet scrubber at a low temperature to remove entrained solids (and even some entrained HF), then it is subjected to a low temperature treatment to remove entrained HF, and then it is subjected to a treatment with NaF. This embodiment is especially suited for large fluorine producing units.

According to another preferred alternative of this preferred embodiment, the fluorine is first treated with liquid HF in a vessel by passing it in the form of bubbles through the liquid HF at a low temperature to remove entrained solids (and even some entrained HF), then it is subjected to a low temperature treatment to remove entrained HF, and then it is subjected to a treatment with NaF. This embodiment is especially suited for small and medium size fluorine producing units.

The $F_2$ obtained in the purification treatment as described above by contacting it with liquid HF to remove solids, subjecting it to a low temperature treatment and/or a treatment with an adsorbent and, preferably having been subjected to a first treatment step, before the treatment with liquid HF, with a filter for solids, is very suitable for many applications, e.g. for the fluorination of fuel tanks, for the surface finishing of polymers, and for the manufacture of $SF_6$ and $IF_5$. Thus, for many technical fields, the first purification treatment provides fluorine sufficiently pure to be applied.

Preferably, before or after the steps of contacting the fluorine with liquid HF, be it in a jet scrubber or by bubbling $F_2$ in to liquid HF in a vessel, and after the low temperature treatment and the adsorption step, respectively, the fluorine is additionally passed through one or more particle filters with small pores. The filter or filters may comprise pores in the range of 1 to 20 μm; of course, particle filters with a pore size lower than 1 μm are also suitable. Pore size denotes the pore diameter. Particle filters with a pore size greater than 20 μm could be applied but may not be effective enough. The particle filters serve to remove any solid particles before the contact with liquid HF, or to remove solids still entrained after the purifying treatment of the present invention; the particle filters may be constructed from materials resistant to $F_2$, especially from steel or Monel metal. Fluorine having passed such particle filters is suitably pure for a lot of technical applications like those mentioned above; a further advantage is that the compressors are protected. Often, it is sufficient to provide a particle filter before the contact with liquid HF; for many purposes, the fluorine is pure enough after passing it through a filter and treating it with liquid HF, a low temperature treatment and a treatment with NaF. The disadvantage of using filters is that the passage of the fluorine through filters results in a certain loss of pressure; the pressure loss increases when the pores start to be plugged.

A preferred field of use for purified $F_2$ is the use as etching agent or doping agent in the manufacture of semiconductors, micro-electromechanical devices, solar cells, TFTs (thin film transistors), or as an agent for cleaning the chambers used in these processes. For these applications, highly pure fluorine is applied. To provide highly pure fluorine for such applications, a final treatment with a particle filter having pores with pore size of lower than 1 μm is foreseen downstream of the adsorbent to remove HF; this particle filter removes any electrolyte solid and any solid originating from the adsorption treatment.

The preferred process for the manufacture of highly purified fluorine especially suitable for the manufacture of semiconductors, micro-electromechanical devices, solar cells, TFTs, or as an agent for cleaning the chambers used in these processes comprises providing a raw fluorine which was manufactured by electrolysis of molten adducts of KF and HF or their solutions in HF and which contains entrained solids including solid adducts of KF and HF, subjecting said raw fluorine to a purification treatment comprising at least one step of contacting the fluorine with liquid hydrogen fluoride to remove entrained particles, at least one subsequent step of a low temperature treatment of the fluorine and at least one step of contacting the fluorine with an adsorbent for hydrogen fluoride, to reduce the content of hydrogen fluoride, at least one subsequent step of subjecting said fluorine with reduced content of hydrogen fluoride to a subsequent purification treatment comprising at least one step of passing the fluorine through a particle filter to remove entrained particles to provide highly purified fluorine, and optionally, an initial step of passing the raw fluorine gas through a particle filter to remove particles before contacting it with liquid hydrogen fluoride.

Preferably, the process comprises an initial step of passing the raw fluorine gas through a particle filter to remove particles before contacting it with liquid hydrogen fluoride.

If an initial step of passing the fluorine through a particle filter is foreseen, the pore size of the particle filter used for the initial step and for the subsequent step may be the same or different. It can be advantageous if the particle filter for the initial step comprises pores having a pore size between 1 and 20 μm, and the second particle filter in the subsequent purification step to provide highly purified fluorine comprises pores mostly lower than 1 μm, down to pore sizes in the nanometer range. The term "mostly" denotes that at least 90% of the pores, and preferably all pores, have a diameter of lower than 1 μm. Preferably, the particle filter for the final solid-removing treatment comprises mostly or only pores with a diameter of lower than 100 nm, more preferably, lower than 10 nm. The particle filter or filters may be made from steel, Monel metal or other materials resistant to fluorine and HF.

A preferred combination of treatments to provide highly purified fluorine from raw fluorine said raw fluorine to a purification treatment comprising at least one step of contacting the fluorine with hydrogen fluoride in a jet gas scrubber or by bubbling the fluorine through liquid hydrogen fluoride in a vessel to remove entrained particles, at least one subsequent step of a low temperature treatment of the fluorine and at least one step of contacting the fluorine with NaF as adsorbent for hydrogen fluoride, to reduce the content of hydrogen fluoride, at least one subsequent step of subjecting said fluorine with reduced content of hydrogen fluoride to a subsequent purification treatment comprising at least one step of passing the fluorine through a particle filter having pores with a diameter lower than 1 μm to remove entrained particles and to provide highly purified fluorine, wherein the particle filter is located downstream of the solid adsorbent to remove any solid adsorbent which may be entrained in the fluorine leaving it and optionally, an initial step of passing the raw fluorine gas through a particle filter to remove particles before contacting it with liquid hydrogen fluoride.

Preferably, the process comprises an initial step of passing the raw fluorine gas through a particle filter to remove particles before contacting it with liquid hydrogen fluoride.

According to one alternative, the process comprises at least one step of contacting the raw fluorine with liquid hydrogen fluoride in a jet gas scrubber to provide pre-purified hydrogen fluoride. This alternative is especially suited for large fluorine-producing units.

According to another embodiment, the process comprises at least one step of bubbling raw fluorine through liquid hydrogen fluoride in a vessel. This alternative is especially suited for small and medium size fluorine producing units, for example, fluorine producing units supplying highly pure fluorine to be used as etchant and chamber cleaning agent in the frame of manufacture of semiconductors, TFTs, photovoltaic cells or MEMS.

$F_2$ with an HF content of equal to or less than 10 ppm and which is essentially free of particles can be prepared according to the process of the invention.

The highly purified fluorine (which was preferably passed through a filter before subjected to a treatment to remove solids by means of liquid HF, then subjected to a treatment with liquid HF to remove solids, to a low temperature treatment to remove HF, to an adsorption treatment to remove HF and to a particle removing treatment with a particle filter having pores with a pore size of lower than 1 μm) can be used for any of the purposes mentioned above. It is preferably applied in the manufacture of semiconductors, micro-electromechanical devices, solar cells, TFTs, or as an agent for cleaning the chambers used in these processes; but if desired, it could also be used in the other processes mentioned above, e.g. for the manufacture of $SF_6$, $IF_5$, for the fluorination of fuel tanks or for finishing the surface of plastic parts.

In the following, some details are given for the preferred field of use of the highly pure fluorine. According to one alternative, the fluorine is used in a method for the manufacture of an item which is the precursor of a semiconductor, a MEMS device, a TFT or a solar panel comprising a step of providing the precursor and contacting, for etching, said precursor with fluorine purified according to the method of the present invention. Processes wherein a precursor is etched with fluorine are numerous; the etching can be promoted thermally and/or by applying plasma. Generally, the purpose of the contact between fluorine and the precursor is to etch a substrate on the precursor. For example, the fluorine can be used in a dry etching process as described in U.S. Pat. No. 5,431,778 for etching of silicon. WO 2007/116033 describes the use of gas mixtures which contain elemental fluorine, for etching of semiconductors, TFTs (flat panel displays) and solar panels. For example, amorphous Si, $SiO_2$, TaN, TiN and SiON can be etched thermally or plasma-supported. WO 2009/080615 describes the use of elemental fluorine as etching gas in the manufacture of micro-electromechanical systems (<<MEMS>>).

According to another alternative, the highly pure fluorine is used as chamber cleaning gas, namely, in a method for the manufacture of a semiconductor, a MEMS device, a TFT or a solar panel which method comprises a step of providing a precursor of the a semiconductor, a MEMS device, a TFT or a solar panel, depositing layers on said precursor in a deposition chamber wherein deposits form at least on a part of the interior of the deposition chamber, and contacting said deposition chamber with fluorine purified according to the method of the present invention to remove at least a part of the deposits in the interior of the deposition chamber. In deposition chambers, certain layers of material, especially semiconducting material, conducting material or isolating material are deposited on substrates. This deposition which is usually performed according to CVD processes (Chemical Vapor Deposition) or PECVD processes (Physically Enhanced Vapor Deposition) is often supported by a remote plasma or a direct plasma in the deposition chamber. During deposition, unwanted deposits form also on the inner walls and other means inside these chambers. These deposited materials comprise or consist of polymeric carbon fluorides and/or metals, metal oxides, metal nitrides, metal oxynitrides, e.g. silicon, silicon oxide, silicon nitride, silicon oxynitride, tungsten, tantalum nitride, or titanium nitride. These deposits must regularly be removed. The purified fluorine obtained according to the present invention is perfectly suited as agent for the removal of these deposits. Such a process is also described in WO 2007/116033. Argon is introduced into a plasma chamber, and the plasma is started, then mixtures of fluorine with argon, nitrogen or both are introduced into a plasma chamber at a pressure preferably in the range of 100 to 800 Pa, a temperature preferably in the range of 150° C. to 300° C., and the treatment is continued until the desired degree of removal of the deposits is achieved.

Should the disclosure of any patents, patent applications, and publications which are incorporated herein by reference conflict with the description of the present application to the extent that it may render a term unclear, the present description shall take precedence.

The following examples are intended to explain the invention further without limiting it.

EXAMPLE 1

Manufacture of $F_2$ with Very low HF and Solids Content for Photovoltaic cell Manufacture 1. Manufacture of Elemental Fluorine An electrolyte salt with a composition of about KF·2HF is filled into an electrolysis cell, heated to about 80-120° C. and molten therein. HF is introduced into the electrolytic cell. A voltage of between 8 to 10 V is applied, and current is passed through the composition of electrolyte salt dissolved in the hydrogen fluoride. Elemental fluorine and elemental hydrogen form in the respective electrode compartments. The raw generated elemental fluorine gas was withdrawn from the electrolytic cells and was fed into the bottom of a jet gas scrubber. Liquid HF which had a temperature of about −80° C. was injected into the scrubber. Solids entrained in the fluorine were removed in the jet gas scrubber.

Then it is passed through a Monel metal frit with pores with a diameter of 1 μm to remove solids. The resultant fluorine has a very low content of entrained solids. The fits are plugged from time to time by filtered solids. They can be cleaned by a treatment with liquids to dissolve the solids.

With this degree of purification, the fluorine can be used especially as fluorinating agent for the manufacture of $SF_6$, $IF_5$, or for the fluorination of fuel tanks or the surface of plastic items.

To provide highly pure $F_2$, the fluorine leaving the fit is passed through a trap cooled to −80° C. In the trap, hydrogen fluoride entrained in the fluorine is condensed and returned to the purification step. Then, it is passed, for further removal of HF, is passed through a tower containing NaF and then through a Monel filter having pores with a diameter lower than 10 nm. The fluorine thus treated is highly pure and, if at all, contains only tolerable trace amounts of solids and HF. With this degree of purification, the highly pure fluorine can be used as etchant in the manufacture of semiconductors, MEMS, TFTs or solar panels and as chamber cleaning agent.

EXAMPLE 2

Purification of $F_2$ in a Jet Gas Scrubber

Fluorine produced electrochemically from a solution of KF in hydrogen fluoride with a composition of approximately KF·2HF as described in example 1 contained some entrained solids, predominantly particles composed of KF·2HF. The raw fluorine gas was withdrawn from the electrolytic cells was fed into the bottom of a jet gas scrubber. Liquid HF which had a temperature of about −80° C. was injected into the scrubber. Solids entrained in the fluorine were removed in the jet gas scrubber.

With this degree of purification, the fluorine can be used especially as fluorinating agent for the manufacture of $SF_6$, $IF_5$, or for the fluorination of fuel tanks or the surface of plastic items.

To provide fluorine with a higher degree of purity, the fluorine leaving the scrubber was then subjected to several low-temperature treatments in cooled traps to remove entrained HF. The fluorine leaving the last cooled traps was passed through an adsorption tower comprising NaF to remove any HF entrained. The HF used for purification is circulated; its volume grows slowly by entrained solids. When the volume reaches a certain upper level, a part of the HF is withdrawn from circulation and is introduced into the electrolytic cell which produces fluorine, to substitute electrolyzed HF.

This purified $F_2$ is suitable as fluorinating agent for the manufacture of $SF_6$, $IF_5$, or for the fluorination of fuel tanks or the surface of plastic items. Though it can be used as etching agent for the manufacture of semiconductors, photovoltaic cells, TFTs or MEMS and as chamber cleaning agent, it is preferred to pass it after leaving the NaF adsorbent additionally through a filter, e.g. a Monel frit with very low pore size, e.g. 1 μm or less, to remove any solids which might still be entrained.

EXAMPLE 3

Purification of $F_2$ and its use as Etchant and Chamber Cleaning Agent

Fluorine produced electrochemically from a solution of KF in hydrogen fluoride with a composition of approximately KF·2HF as described in example 1 contains some entrained solids, predominantly particles composed of KF·2HF. The raw fluorine gas withdrawn from the electrolytic cells is fed into the bottom of a jet gas scrubber. Liquid HF which has a temperature of about −80° C. is injected into the scrubber. Solids entrained in the fluorine are removed in the jet gas scrubber. The fluorine leaving the scrubber is then subjected to a low-temperature treatment in several cooled traps to remove entrained HF. The fluorine leaving the cooled traps is passed through an adsorption tower comprising NaF to remove any HF entrained. The HF used for purification is circulated; its volume grows slowly by entrained solids. When the volume has reached a certain upper level, a part of the HF was withdrawn from circulation and was introduced into the electrolytic cell which produces fluorine, to substitute electrolyzed HF. After leaving the NaF tower, the $F_2$ is passed through a Monel filter to remove any remaining solids thus providing highly pure $F_2$.

The highly pure fluorine is pressurized and then delivered in a direct line, under a pressure of about 4 Bara, to a tool for the manufacture of semiconductors, photovoltaic cells, TFTs or MEMS. If desired, it can be mixed with nitrogen and/or noble gases, e.g. argon, before its delivery. Alternatively, the fluorine, optionally in a mixture with nitrogen and/or a noble gas, e.g. argon, can be filled in pressure-resistant bottles for later use. In a comparable manner, the fluorine may also be used as chamber cleaning gas to clean plasma apparatus used for the manufacture of semiconductors, photovoltaic cells, TFTs or MEMS.

EXAMPLE 4

Manufacture of $F_2$ with very low HF and Solids Content for Photovoltaic cell Manufacture 1. Manufacture of Elemental Fluorine An electrolyte salt with a composition of about KF·2HF is filled into an electrolysis cell, heated to about 80-120° C. and molten therein. HF is introduced into the electrolytic cell. A voltage of between 8 to 10 V is applied, and current is passed through the composition of electrolyte salt dissolved in the hydrogen fluoride. Elemental fluorine and elemental hydrogen form in the respective electrode compartments. The generated raw elemental fluorine gas is withdrawn from the respective compartments of the electrolytic cells and is passed through a particle filter with pore sizes of less than 1 μm. The fluorine having passed the particle filter is fed by means of an immersion tube via a Monel frit into liquid HF in a vessel. The liquid HF has a temperature of about −80° C. by cooling it indirectly with liquid nitrogen. Fluorine leaving the liquid HF is collected in the space above the liquid HF in the vessel and is passed through a trap cooled to −80° C. In the trap, hydrogen fluoride entrained in the fluorine is condensed and returned to the purification step. The fluorine leaving the trap is passed through a tower containing NaF to remove any HF still contained and then through a Monel metal fit with pores having a diameter of less than 10 nm to remove any entrained solids. The frits can be cleaned, in case of plugging, by a treatment with liquids to dissolve the solids.

The fluorine thus obtained is highly pure and, if at all, contains only tolerable trace amounts of solids and HF. With this degree of purification, the highly pure fluorine can be used as etchant in the manufacture of semiconductors, MEMS, TFTs or solar panels and as chamber cleaning agent.

The invention claimed is:

1. A process for the manufacture of purified fluorine, comprising subjecting fluorine which contains solid impurities to a solid-removing treatment wherein the solid-removing treatment comprises at least one step of contacting the fluorine with liquid hydrogen fluoride; subsequently subjecting the fluorine to a purification treatment comprising at least one step of removing hydrogen fluoride from the fluorine after contact with liquid hydrogen fluoride; optionally, subjecting the fluorine to a step of contacting said fluorine with an adsorbent for HF; and optionally, subjecting the fluorine to a step of passing said fluorine through a particle filter for the removal of entrained solids.

2. The process of claim 1, wherein, in the solid-removing treatment, the fluorine is contacted with liquid hydrogen fluoride in a jet gas scrubber.

3. The process of claim 1, wherein, in the solid-removing treatment, the fluorine is contacted with liquid HF by bubbling said fluorine through liquid HF in a vessel.

4. The process of claim 1, wherein the at least one step of removing hydrogen fluoride is a low temperature treatment.

5. The process of claim 1, comprising at least one step of contacting the fluorine, after the solid-removing treatment with liquid HF, with an adsorbent for HF, and subsequently at least one step of passing the fluorine through a particle filter for the removal of entrained solids.

6. The process of claim 1, wherein the purification treatment comprises: at least one step of a low temperature treatment, at least one subsequent step of contacting the fluorine after the low temperature treatment with an adsorbent for HF, and, after the contact of the fluorine with the adsorbent for HF, at least one subsequent step of passing the fluorine through a particle filter to provide highly pure fluorine.

7. The process of claim 5, wherein the particle filter to provide highly pure fluorine comprises pores having a diameter less than 1 μm.

8. The process of claim 7, wherein the particle filter comprises pores having a diameter less than 10 nm.

9. The process of claim 5, wherein the adsorbent for HF is sodium fluoride.

10. The process of claim 1, wherein continuously or intermittently, at least a part of the liquid HF is withdrawn from the solid-removing treatment, and wherein withdrawn HF is introduced into an electrolytic cell or into electrolytic cells for $F_2$ production.

11. The process of claim 1, wherein the fluorine is electrolytically produced in one or more electrolytic cells from an electrolyte containing KF dissolved in HF.

12. The process of claim 11, wherein the fluorine electrolytically produced is passed through a particle filter and is subsequently subjected to the solid removing treatment and the purification treatment.

13. The process of claim 11, wherein the fluorine electrolytically produced is passed through a particle filter and subsequently subjected to the solid-removing treatment comprising at least one step of contacting the fluorine with liquid hydrogen fluoride in a jet gas scrubber or by bubbling the fluorine through liquid HF in a vessel, and wherein the process further comprises subjecting the fluorine after the treatment with liquid HF to a low temperature treatment, subsequently contacting the fluorine with NaF as adsorbent for HF, and subsequently passing the fluorine through at least one particle filter having pores with a diameter of less than 1 μm.

14. A method for the manufacture of a semiconductor, a micro-electromechanical system, TFT (flat panel display) or a solar cell comprising a step of etching an item with fluorine purified according to the method of claim 5.

15. The method of claim 4, wherein the pressure is equal to or greater than 1 and equal to or lower than 20 bar (abs).

16. The process of claim 5, wherein continuously or intermittently, at least a part of the liquid HF is withdrawn from the solid-removing treatment, and wherein withdrawn HF is introduced into an electrolytic cell or into electrolytic cells for $F_2$ production.

17. A method for the manufacture of a semiconductor, a micro-electromechanical system, TFT (flat panel display) or a solar cell, said method comprising a step of depositing layers on items in a deposition chamber, wherein deposits form at least on a part of the interior of the deposition chamber, and further comprising contacting said deposition chamber with fluorine purified according to the method of claim 5 to remove at least a part of the deposits in the interior of the deposition chamber.

\* \* \* \* \*